(12) United States Patent
Obata et al.

(10) Patent No.: US 8,854,010 B2
(45) Date of Patent: Oct. 7, 2014

(54) CONTROL APPARATUS AND CONTROL METHOD FOR ELECTRIC STORAGE APPARATUS

(75) Inventors: Hiroyuki Obata, Nagoya (JP); Yukimasa Nishide, Toyota (JP); Toshio Otagiri, Kariya (JP)

(73) Assignee: Toyota Jidosha Kabushiki Kaisha, Toyota (JP)

(*) Notice: Subject to any disclaimer, the term of this patent is extended or adjusted under 35 U.S.C. 154(b) by 0 days.

(21) Appl. No.: 13/882,586

(22) PCT Filed: Jan. 27, 2011

(86) PCT No.: PCT/JP2011/000449
§ 371 (c)(1),
(2), (4) Date: Apr. 30, 2013

(87) PCT Pub. No.: WO2012/101678
PCT Pub. Date: Aug. 2, 2012

(65) Prior Publication Data
US 2013/0293200 A1 Nov. 7, 2013

(51) Int. Cl.
*G01R 31/36* (2006.01)
*H02J 7/00* (2006.01)
*H01M 10/48* (2006.01)
*H01M 10/44* (2006.01)

(52) U.S. Cl.
CPC ............... *H02J 7/00* (2013.01); *H02J 7/0021* (2013.01); *H01M 10/484* (2013.01); *G01R 31/3679* (2013.01); *Y02E 60/12* (2013.01); *H01M 10/44* (2013.01); *Y02T 10/7055* (2013.01); *G01R 31/36* (2013.01)
USPC .......................................... 320/136; 320/134

(58) Field of Classification Search
CPC .................................................... Y02E 60/12
See application file for complete search history.

(56) References Cited

U.S. PATENT DOCUMENTS 5,644,212 A * 7/1997 Takahashi ...................... 320/134
6,232,743 B1 * 5/2001 Nakanishi ....................... 320/104
(Continued)

FOREIGN PATENT DOCUMENTS

| DE | 10 2007038 586 A1 | 2/2009 |
|----|---|---|
| JP | A-2001-186682 | 7/2001 |
| JP | A-2002-243813 | 8/2002 |
| JP | A-2003/346919 | 12/2003 |

(Continued)

OTHER PUBLICATIONS

Jun. 20, 2012 International Preliminary Report on Patentability issued in PCT Application No. PCT/JP2011/000449; with English-language translation.

*Primary Examiner* — Drew A Dunn
*Assistant Examiner* — Steve T Chung
(74) *Attorney, Agent, or Firm* — Oliff PLC (57) ABSTRACT

A control apparatus controlling discharge of a secondary battery such that a discharge power of the secondary battery does not exceed an upper limit value has a current sensor and a controller. The current sensor detects a current value during charge and discharge of the secondary battery. The controller calculates an evaluation value for determining a first deterioration component depending on nonuniformity of an ion concentration in an electrolyte of the secondary battery by using the detection result of the current sensor, and reduces the upper limit value when the integral value of the evaluation values exceeding a target value exceeds a threshold value. The controller estimates a second deterioration component depending on the material of the secondary battery and changes the threshold value such that deterioration due to the first deterioration component is permitted in association with the second deterioration component.

13 Claims, 8 Drawing Sheets

(56) References Cited

U.S. PATENT DOCUMENTS

| | | | |
|---|---|---|---|
| 6,344,728 B1* | 2/2002 | Kouzu et al. | 320/116 |
| 6,563,291 B2* | 5/2003 | Tamura et al. | 320/116 |
| 7,482,779 B2* | 1/2009 | Suzuki | 320/106 |
| 2002/0113595 A1* | 8/2002 | Sakai et al. | 324/433 |
| 2005/0083017 A1 | 4/2005 | Suzuki | |
| 2009/0259420 A1* | 10/2009 | Greening et al. | 702/63 |
| 2010/0241376 A1 | 9/2010 | Kikuchi et al. | |

FOREIGN PATENT DOCUMENTS

| | | |
|---|---|---|
| JP | A-2005/124353 | 5/2005 |
| JP | A-2008-24124 | 2/2008 |
| JP | A-2009-123435 | 6/2009 |
| JP | A_2009-160953 | 7/2009 |
| JP | A-2010-212013 | 9/2010 |
| WO | WO 2009/063688 A1 | 5/2009 |
| WO | WO 2010/079595 A1 | 7/2010 |

* cited by examiner

CONTROL APPARATUS AND CONTROL METHOD FOR ELECTRIC STORAGE APPARATUS

TECHNICAL FIELD

The present invention provides a control apparatus and a control method for controlling charge/discharge of an electric storage element through the evaluation of the deterioration state of the electric storage element.

BACKGROUND ART

A technique described in Patent Document 1 involves calculating an evaluation value for evaluating the deterioration of a battery due to high rate discharge based on a history of current values obtained in charge/discharge of the battery. When the evaluation value does not exceed a target value, the upper limit value for use in controlling battery discharge is set at the maximum value. On the other hand, when the evaluation value exceeds the target value, the upper limit value is set at a value smaller than the maximum value.

According to Patent Document 1, when the evaluation value does not exceed the target value, the upper limit value is set at the maximum value to satisfy the dynamic performance of a vehicle which meets the requirements of a driver. On the other hand, when the evaluation value exceeds the target value, the upper limit value is set at the value smaller than the maximum value to suppress deterioration due to the high rate discharge.

PRIOR ART DOCUMENTS

Patent Documents

[Patent Document 1] Japanese Patent Laid-Open No. 2009-123435 (FIG. 4, FIG. 7 and the like)
[Patent Document 2] Japanese Patent Laid-Open No. 2008-024124
[Patent Document 3] Japanese Patent Laid-Open No. 2009-160953

SUMMARY OF THE INVENTION

Problems to be Solved by the Invention

In the technique described in Patent Document 1, to suppress the deterioration due to the high rate discharge, the upper limit value is changed to limit the output from the battery when the evaluation value exceeds the target value. The change of the upper limit value caused solely by the evaluation value exceeding the target value may not ensure the output required of the battery.

Means for Solving the Problems

According to a first aspect, the present invention provides a control apparatus for controlling discharge of a secondary battery such that a discharge power of the secondary battery does not exceed an upper limit value, and the control apparatus includes a current sensor and a controller. The current sensor detects a current value during charge/discharge of the secondary battery. The controller calculates an evaluation value for determining a first deterioration component depending on nonuniformity of an ion concentration in an electrolyte of the secondary battery by using the detection result of the current sensor, and reduces the upper limit value when the integral value of the evaluation values exceeding a target value exceeds a threshold value. The controller estimates a second deterioration component depending on the material of the secondary battery and changes the threshold value such that deterioration due to the first deterioration component is permitted in association with the second deterioration component.

The evaluation value is increased in accordance with an increase in the nonuniformity of the ion concentration and is reduced in accordance with a reduction in the nonuniformity of the ion concentration. As the second deterioration component is increased, the first deterioration component is reduced. Thus, the estimation of the second deterioration component can specify the extent to which the deterioration due to the first deterioration component can be permitted in association with the second deterioration component.

The controller can calculate the integral value by integrating part of the evaluation value that exceed the target value. When the evaluation value is a positive value, the target value which is a positive value can be used, and when the evaluation value is a negative value, the target value which is a negative value can be used. In this case, when the positive evaluation value exceeds the positive target value, a part of the positive evaluation value that exceeds the positive target value can be added. When the negative evaluation value exceeds the negative target value, a part of the negative evaluation value that exceeds the negative target value can be subtracted.

The second deterioration component can be estimated by using a temperature and a current conduction amount of the secondary battery. The temperature of the secondary battery includes a temperature of the secondary battery when charge/discharge is performed and a temperature of the secondary battery when charge/discharge is not performed. The temperature of the secondary battery when charge/discharge is not performed can be used to estimate a portion of the second deterioration component. The temperature and the current conduction amount of the secondary battery when charge/discharge is performed can be used to estimate the remaining portion of the second deterioration component.

A map for determining the threshold value can be stored in a memory in association with the second deterioration component. The estimation of the second deterioration component allows the specification of a map associated with that second deterioration component, and that map can be used to determine the threshold value. The map for determining the threshold value which can be used shows the relationship between the threshold value, the temperature of the secondary battery when charge/discharge is performed, and the use state of the secondary battery. When the output from the secondary battery is used to run a vehicle, the charge/discharge amount of the secondary battery relative to the running distance of the vehicle (Ah/km) can be used as the use state of the secondary battery.

According to a second aspect, the present invention provides a control method for controlling discharge of a secondary battery such that a discharge power of the secondary battery does not exceed an upper limit value, including the steps of detecting a current value during charge/discharge of the secondary battery; and calculating an evaluation value for determining a first deterioration component depending on nonuniformity of an ion concentration in an electrolyte of the secondary battery by using a detection result of the current sensor. The method further includes the step of determining whether or not the evaluation value exceeds a target value, and reducing the upper limit value when an integral value of the evaluation values exceeding the target value exceeds a threshold value. The method further includes the steps of estimating a second deterioration component depending on a material of the secondary battery; and changing the threshold value such that deterioration due to the first deterioration component is permitted in association with the second deterioration component.

Advantage of the Invention

According to the present invention, the integral value of the evaluation values is calculated when the evaluation value exceeds the target value, and the upper limit value for use in the control of discharge of the secondary battery is reduced when the integral value exceeds the threshold value. Since the threshold value is changed such that the deterioration due to the first deterioration component is permitted in accordance with the estimated second deterioration component, the power from the secondary battery can be used within the range in which the deterioration due to the first deterioration component is permitted. Thus, the output required of the secondary battery is easily ensured within the range in which the deterioration due to the first deterioration component is permitted.

EMBODIMENTS OF THE INVENTION

An embodiment of the present invention will hereinafter be described.

First Embodiment

Figure 1:
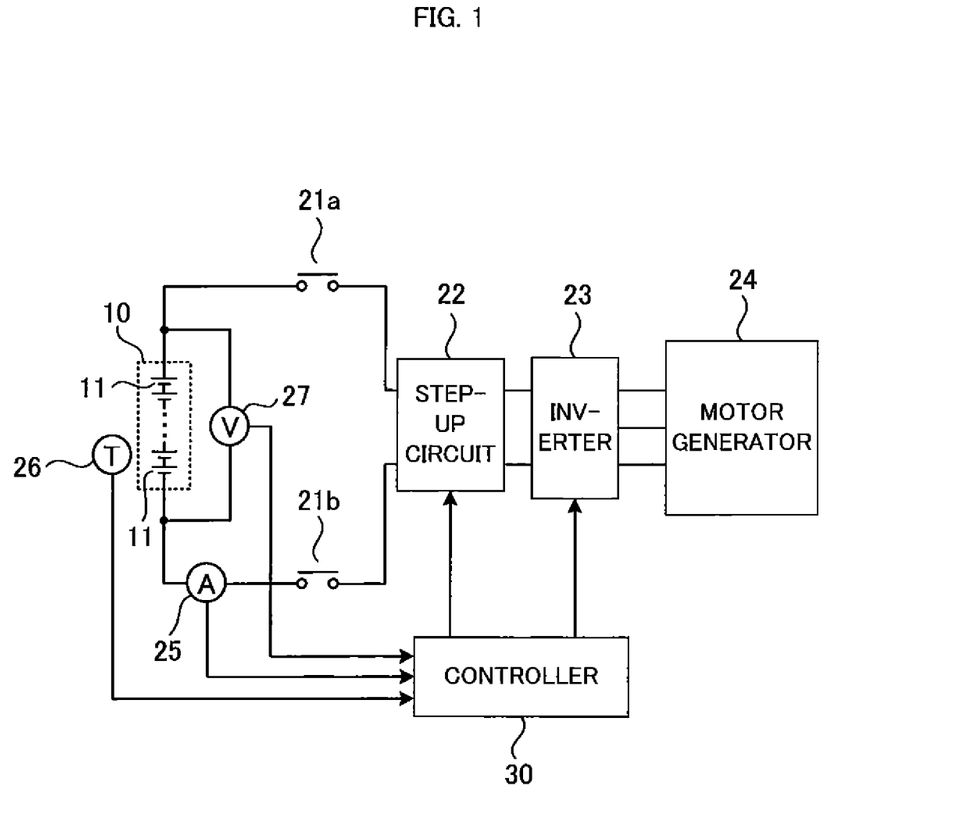
FIG. 1 is a block diagram showing a battery system according to a first embodiment.

A battery system according to First Embodiment is described with reference to FIG. 1. FIG. 1 is a diagram showing the configuration of the battery system.

The battery system shown in FIG. 1 is mounted on a vehicle. Examples of the vehicle include a hybrid vehicle and an electric vehicle. The hybrid vehicle includes a fuel cell, an internal-combustion engine or the like in addition to an assembled battery as the power source for running of the vehicle. The electric vehicle includes only the assembled battery as the power source for the vehicle.

An assembled battery 10 has a plurality of cells 11 connected electrically in series. The number of the cells 11 constituting the assembled battery 10 can be set as appropriate based on the output required of the assembled battery 10 or the like. The plurality of cells 11 included in the assembled battery 10 may be connected electrically in parallel. A secondary battery such as a nickel metal hydride battery and a lithium-ion battery can be used as the cell 11.

When the lithium-ion battery is used as the cell 11, a positive electrode is formed of a material capable of occluding and releasing lithium ions, and examples of the material can include lithium cobalt oxide and lithium manganese oxide. A negative electrode is formed of a material capable of occluding and releasing lithium ions, and an example of the material can be carbon. When the cell 11 is charged, the positive electrode releases the lithium ions into an electrolytic solution and the negative electrode occludes the lithium ions present in the electrolytic solution. When the cell 11 is discharged, the positive electrode occludes the lithium ions present in the electrolyte solution and the negative electrode releases the lithium ions into the electrolytic solution.

The assembled battery 10 is connected to a step-up circuit 22 through system main relays 21a and 21b. The step-up circuit 22 increases an output voltage of the assembled battery 10. The step-up circuit 22 is connected to an inverter 23. The inverter 23 converts a DC power from the step-up circuit 22 into an AC power. A motor generator (AC motor) 24 receives the AC power from the inverter 23 to generate a kinetic energy for running of the vehicle. The kinetic energy generated by the motor generator 24 is transferred to wheels.

The step-up circuit 22 may be omitted. The inverter 23 may be omitted when a DC motor is used as the motor generator 24.

For decelerating or stopping the vehicle, the motor generator 24 converts a kinetic energy produced in braking of the vehicle into an electric energy. The AC power generated by the motor generator 24 is converted into a DC power by the inverter 23. The step-up circuit 22 reduces the output voltage of the inverter 23 and supplies the reduced voltage to the assembled battery 10. Thus, the regenerative power can be stored in the assembled battery 10.

A current sensor 25 detects an electric current passing through the assembled battery 10 in charge/discharge of the assembled battery 10 and outputs the detection result to a controller 30. A temperature sensor 26 detects the temperature of the assembled battery 10 and outputs the detection result to the controller 30. The number of temperature sensors 26 can be set as appropriate. When a plurality of temperature sensors 26 are used, the average value of temperatures detected by the plurality of temperature sensors 26 can be used as the temperature of the assembled battery 10, or the temperature detected by a particular one of the temperature sensors 26 can be used as the temperature of the assembled battery 10.

A voltage sensor 27 detects the voltage of the assembled battery 10 and outputs the detection result to the controller 30. While the voltage of the assembled battery 10 is detected in the present embodiment, the present invention is not limited thereto. For example, the voltage of the cell 11 serving as the component of the assembled battery 10 may be detected. Alternatively, the plurality of cells 11 constituting the assembled battery 10 may be divided into a plurality of blocks such that the voltage of each of the blocks is detected. Each block includes at least two cells 11.

The controller 30 controls the operations of the system main relays 21a and 21b, the step-up circuit 22, and the inverter 23. The controller 30 has a memory 31 for storing various types of information. While the controller 30 contains the memory 31 in the present embodiment, the memory 31 may be provided outside the controller 30.

When an ignition switch of the vehicle is switched from OFF to ON, the controller 30 switches the system main relays 21a and 21b from OFF to ON, and operates the step-up circuit 22 and the inverter 23. When the ignition switch is switched from ON to OFF, the controller 30 switches the system main relays 21a and 21b from ON to OFF, and stops the operation of the step-up circuit 22 and the inverter 23.

Figure 2:
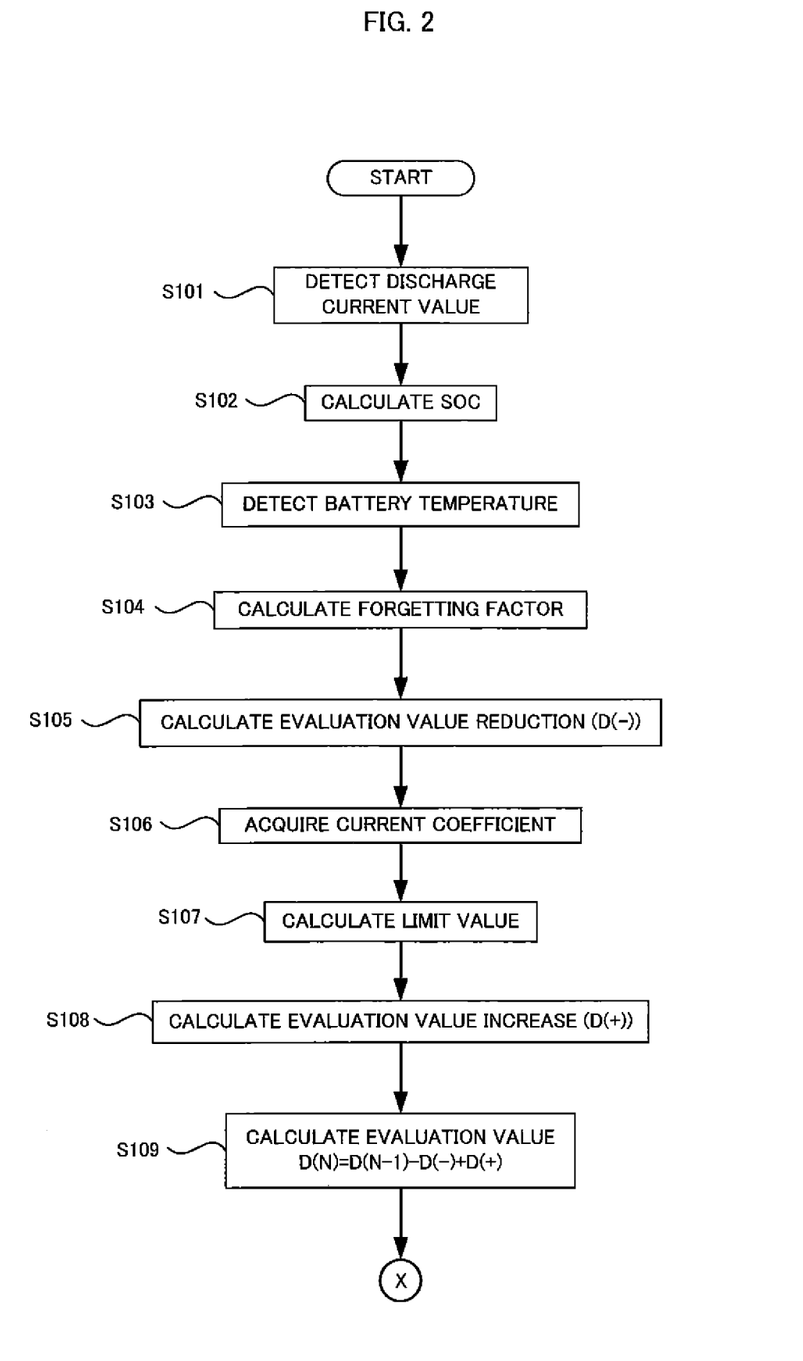
FIG. 2 is a flow chart showing processing of controlling charge/discharge of an assembled battery in the first embodiment.
Figure 3:
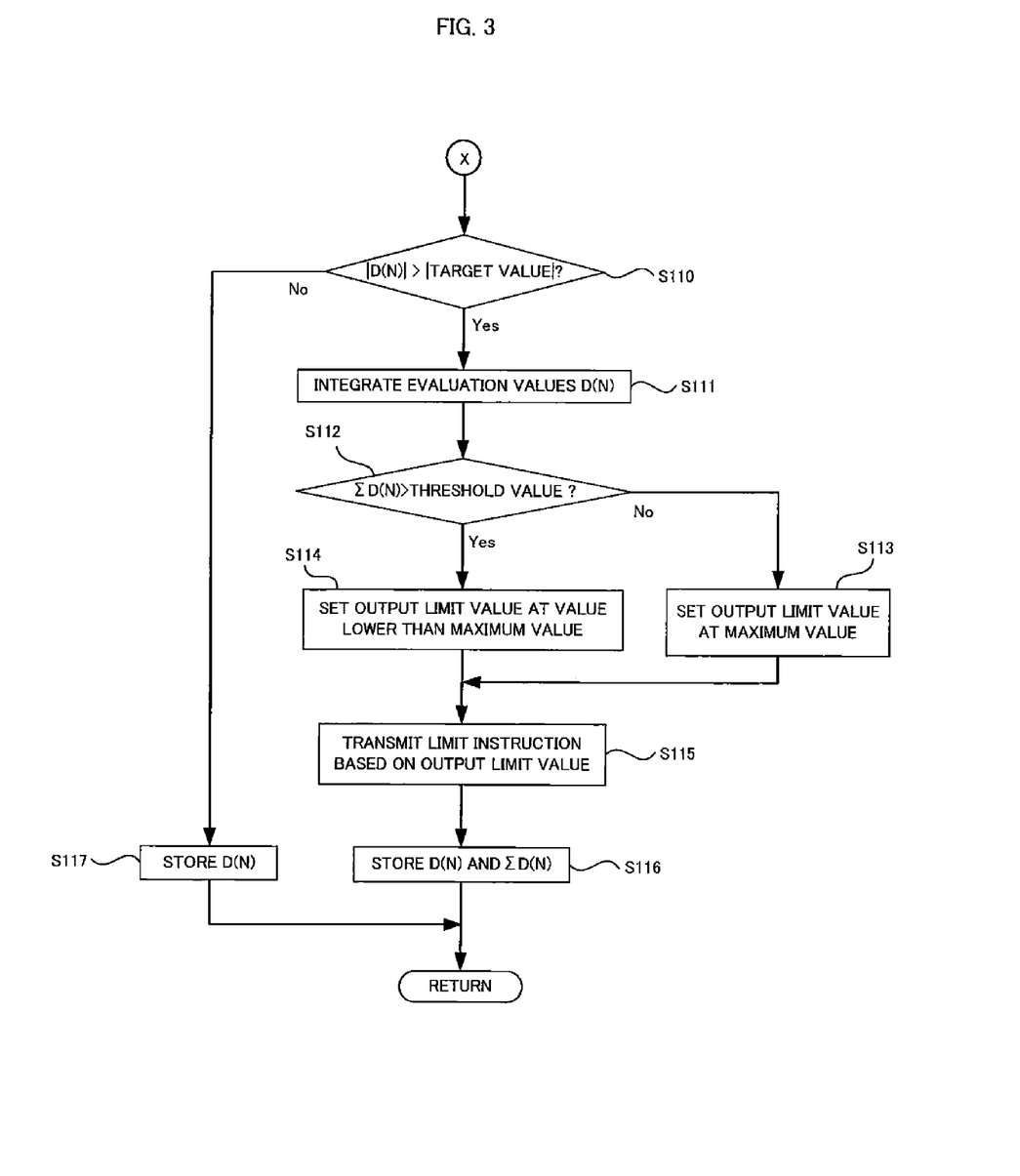
FIG. 3 is a flow chart showing the processing of controlling charge/discharge of an assembled battery in the first embodiment.

Next, description is made of processing of controlling charge/discharge of the assembled battery 10 with reference to flow charts shown in FIG. 2 and FIG. 3. The processing shown in FIG. 2 and FIG. 3 is repeatedly performed at preset time intervals (cycle times). The processing shown in FIG. 2 and FIG. 3 is performed by a CPU included in the controller 30 that executes a program stored in the memory 31.

At step S101, the controller 30 acquires a discharge current value based on an output signal from the current sensor 25. The discharge current value is a positive value when the assembled battery 10 is discharged, whereas the discharge current value is a negative value when the assembled battery 10 is charged.

At step S102, the controller 30 calculates the SOC (State Of Charge) of the assembled battery 10 based on the discharge current value acquired at step S101. Specifically, the controller 30 can calculate the SOC of the assembled battery 10 by summing the current values acquired when the charge/discharge of the assembled battery 10 are performed. The method of the SOC calculation is not limited to that described in the present embodiment, and any known method can be selected as appropriate.

At step S103, the controller 30 acquires the temperature of the assembled battery 10 based on an output signal from the temperature sensor 26. At step S104, the controller 30 calculates a forgetting factor based on the SOC calculated at step S102 and the temperature of the assembled battery 10 acquired at step S103. The forgetting factor is a factor associated with the diffusion rate of the lithium ions present in the electrolytic solution of the cell 11. The forgetting factor is set within a range which satisfies the condition shown in the following expression (1):

$$0 < A \times \Delta T < 1 \quad (1)$$

where A represents the forgetting factor and $\Delta T$ represents the cycle time when the processing shown in FIG. 2 and FIG. 3 is repeatedly performed.

Figure 4:
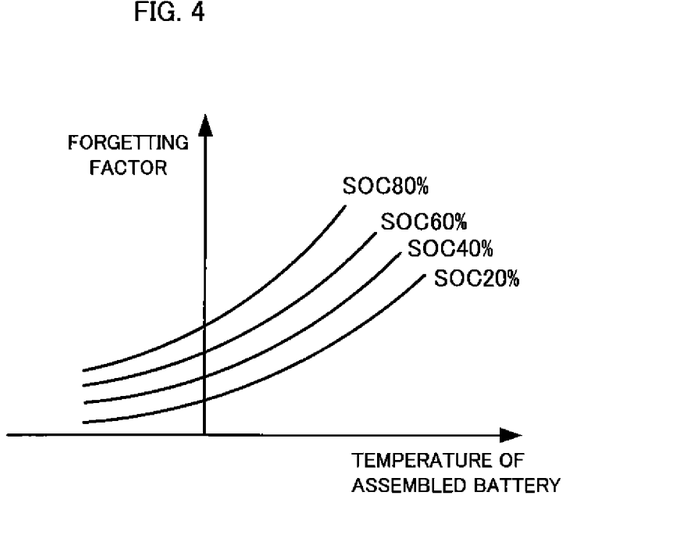
FIG. 4 is a graph showing the relationship between a forgetting factor and the temperature of the assembled battery in the first embodiment.

For example, the controller 30 can use a map shown in FIG. 4 to specify the forgetting factor. In FIG. 4, the vertical axis represents the forgetting factor and the horizontal axis represents the temperature of the assembled battery 10. The map shown in FIG. 4 can be previously obtained by experiment or the like and stored in the memory 31. In the map shown in FIG. 4, as the diffusion rate of the lithium ions becomes higher, the forgetting factor becomes higher. Specifically, at the same temperature of the assembled battery 10, the forgetting factor becomes higher as the SOC of the assembled battery 10 becomes higher. At the same SOC of the assembled battery 10, the forgetting factor becomes higher as the temperature of the assembled battery 10 becomes higher.

At step S105, the controller 30 calculates an evaluation value reduction D(−). The evaluation value D(N) is a value for evaluating the deterioration state (high rate deterioration, later described) of the assembled battery 10 (cell 11).

High rate discharge of the cell 11, when continuously performed, may cause a phenomenon in which the internal resistance of the cell 11 is increased and the output voltage of the cell 11 starts to drop steeply. If the phenomenon continues, the cell 11 may be deteriorated. The deterioration due to the high rate discharge is referred to as high rate deterioration (corresponding to a first deterioration component). A possible cause of the high rate deterioration is a nonuniform ion concentration in the electrolytic solution of the cell 11 resulting from the continuous high rate discharge.

When the high rate deterioration occurs, the output voltage of the cell 11 may not be recovered by reducing the discharge current value or charging the cell 11. The high rate discharge needs to be suppressed before the high rate deterioration occurs. Thus, the evaluation value D(N) is set as the value for evaluating the high rate deterioration in the present embodiment. The method of calculating the evaluation value D(N) is described later.

The evaluation value reduction D(−) is calculated in association with reduced nonuniformity of the lithium ion concentration caused by the diffusion of the lithium ions in the period from the previous (immediately preceding) calculation of the evaluation value D(N) to the expiration of one cycle time. For example, the controller 30 can calculate the evaluation value reduction D(−) based on the following expression (2):

$$D(-) = A \times \Delta T \times D(N-1) \quad (2)$$

where A and $\Delta T$ are identical to those in the expression (1). D(N−1) represents the evaluation value calculated previously (immediately before). D(0) as the initial value can be set at zero, for example.

As shown in the expression (1), the value of "$A \times \Delta T$" ranges from zero to one. As the value of "$A \times \Delta T$" approaches one, the evaluation value reduction D(−) becomes larger. In other words, the evaluation value reduction D(−) becomes larger as the forgetting factor becomes higher or the cycle time becomes longer. The method of calculating the reduction D(−) is not limited to that described in the present embodiment, and any method can be used as long as the reduced nonuniformity of the lithium ion concentration can be determined.

At step S106, the controller 30 reads a current coefficient previously stored in the memory 31. At step S107, the controller 30 calculates a limit value based on the SOC of the assembled battery 10 calculated at step S102 and the temperature of the assembled battery 10 acquired at step S103.

Figure 5:
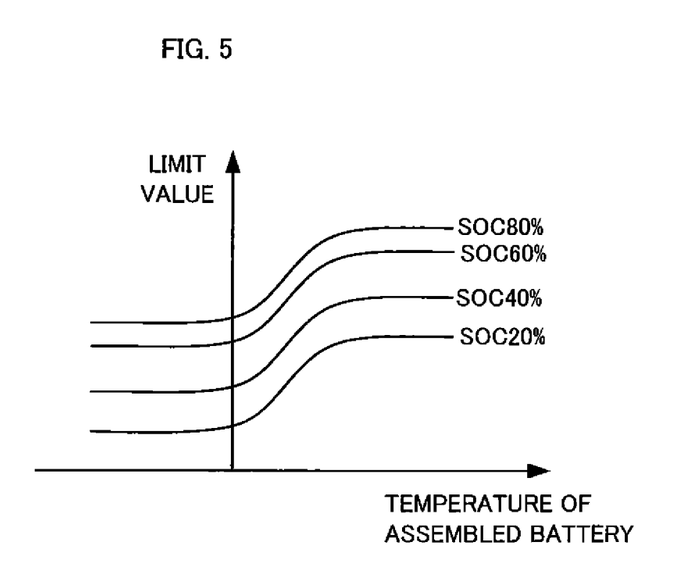
FIG. 5 is a graph showing the relationship between a limit value and the temperature of the assembled battery in the first embodiment.

For example, the controller 30 can calculate the limit value with reference to a map shown in FIG. 5. The map shown in FIG. 5 can be previously obtained by experiment or the like and stored in the memory 31. In FIG. 5, the vertical axis represents the limit value and the horizontal axis represents the temperature of the assembled battery 10. In the map shown in FIG. 5, at the same temperature of the assembled battery 10, the limit value becomes higher as the SOC of the assembled battery 10 becomes higher. At the same SOC of the assembled battery 10, the limit value becomes higher as the temperature of the assembled battery 10 becomes higher.

At step S108, the controller 30 calculates an evaluation value increase (D+). The evaluation value increase D(+) is calculated in association with increased nonuniformity of the lithium ion concentration caused by the discharge in the period from the prior (immediately preceding) calculation of the evaluation value D(N−1) to the expiration of one cycle time. For example, the controller 30 can calculate the evaluation value increase D(+) based on the following expression (3):

$$D(+) = B/C \times I \times \Delta T \quad (3)$$

where B represents the current coefficient, for which the value acquired in the processing at step S106 is used. C represents the limit value. I represents the discharge current value, for which the value detected at step S101 is used. ΔT is identical to that in the expression (1).

As seen from the expression (3), the evaluation value increase D(+) becomes higher as the discharge current value becomes higher or the cycle time becomes longer. The method of calculating the increase D(+) is not limited to the calculation method described in the present embodiment.

At step S109, the controller 30 calculates an evaluation value D(N) in the present cycle time. The evaluation value D(N) can be calculated on the basis of the following expression (4):

$$D(N)=D(N-1)-D(-)+D(+) \quad (4)$$

where D(N) represents the evaluation value in the present cycle time, and D(N−1) represents the evaluation value in the previous (immediately preceding) cycle time. D(0) as the initial value can be set at zero, for example. D(−) and D(+) represent the reduction and the increase in the evaluation value D, respectively, for which the values calculated at steps S105 and S108 are used.

In the present embodiment, the evaluation value D(N) can be calculated by taking account of the increased nonuniformity of the lithium ion concentration and the reduced nonuniformity of the lithium ion concentration as shown in the expression (4). Thus, the change (increase and reduction) in the nonuniformity of the lithium ion concentration presumed to cause the high rate deterioration can be appropriately reflected in the evaluation value D(N). This makes it possible to know, based on the evaluation value D(N), how close the state of the assembled battery 10 is to the state in which the high rate deterioration occurs.

At step S110, the controller 30 determines whether or not the evaluation value D(N) calculated at step 109 exceeds a predetermined target value. The target value is set at a value smaller than the evaluation value D(N) at which the high rate deterioration starts to occur. When the evaluation value D(N) exceeds the target value, the controller 30 proceeds to step S111, and when not, the controller 30 proceeds to step S117.

Figure 6:
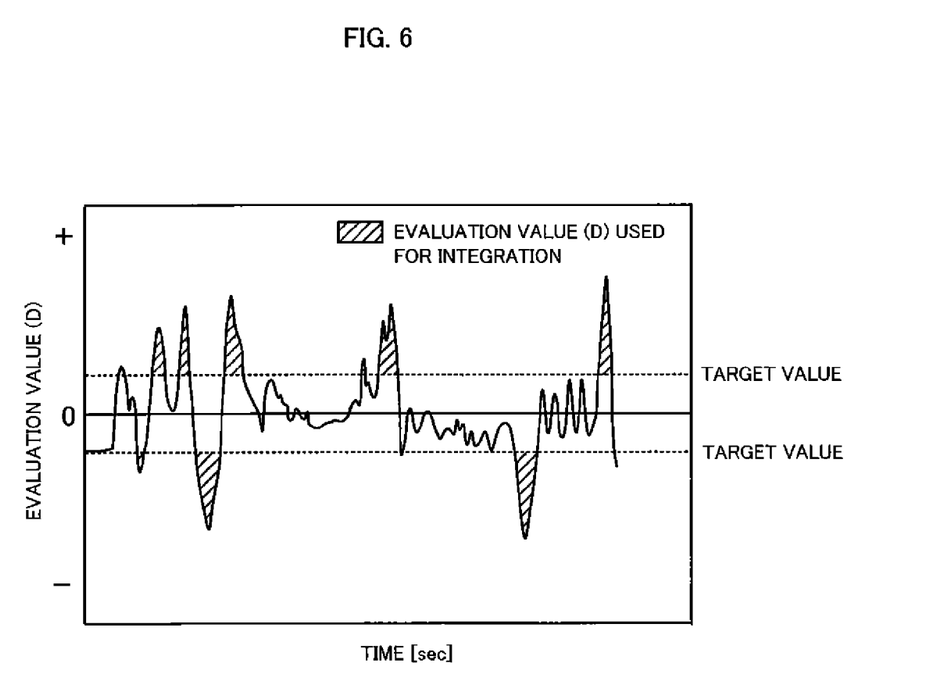
FIG. 6 is a graph showing changes in an evaluation value in the first embodiment.

In the present embodiment, the target value is set on each of a positive side and a negative side of the evaluation value D(N) as shown in FIG. 6. FIG. 6 is a timing chart showing changes in the evaluation value D(N) (by way of example). The target values on the positive side and the negative side have the same absolute values. At step S110, when the positive evaluation value D(N) is higher than the positive target value and the negative evaluation value D(N) is lower than the negative target value, the controller proceeds to step S111. In other words, when the absolute value of the evaluation value D(N) exceeds the absolute value of the target value, the controller proceeds to step S111.

At step S111, the controller 30 performs integration of the evaluation values D(N). Specifically, as shown in FIG. 6, when the evaluation value D(N) exceeds the target value, the controller 30 performs the integration of the part of the evaluation value D(N) that exceeds the target value. Each time the evaluation value D(N) exceeds the target value, the integration is performed.

When the positive evaluation value D(N) is higher than the positive target value, the part of the evaluation value D(N) that is higher than the target value is added. On the other hand, when the negative evaluation value D(N) is lower than the negative target value, the part of the evaluation value D(N) that is lower than the target value is subtracted.

While the part of the negative evaluation value D(N) that is lower than the target value on the negative side is subtracted when the evaluation value D(N) is lower than the target value in the present embodiment, the present invention is not limited thereto. Specifically, the integration of the evaluation value may be performed only when the positive evaluation value D(N) is higher than the target value on the positive side. In this case, each time the evaluation value D(N) is higher than the target value, the part of the evaluation value D(N) that is higher than the target value is added.

While the integration is performed only on the part of the evaluation value D(N) that exceeds the target value in the present embodiment, the present invention is not limited thereto. Specifically, when the evaluation value D(N) exceeds the target value, the integration of this evaluation value D(N) may be performed. In this case, a threshold value, later described, may be changed in view of the target value.

At step S112, the controller 30 determines whether or not the integral value ΣD(N) of the evaluation values is larger than the threshold value. The threshold value is a value for permitting the high rate deterioration. When the integral value ΣD(N) is smaller than the threshold value at step S112, the controller proceeds to step S113, and when not, the controller proceeds to step S114.

The threshold value is not a fixed value but is changeable in accordance with the deterioration state of the assembled battery 10 (cell 11), that is, how the assembled battery 10 is used. Description is made of a method of determining the threshold value with reference to FIG. 7.

Figure 7:
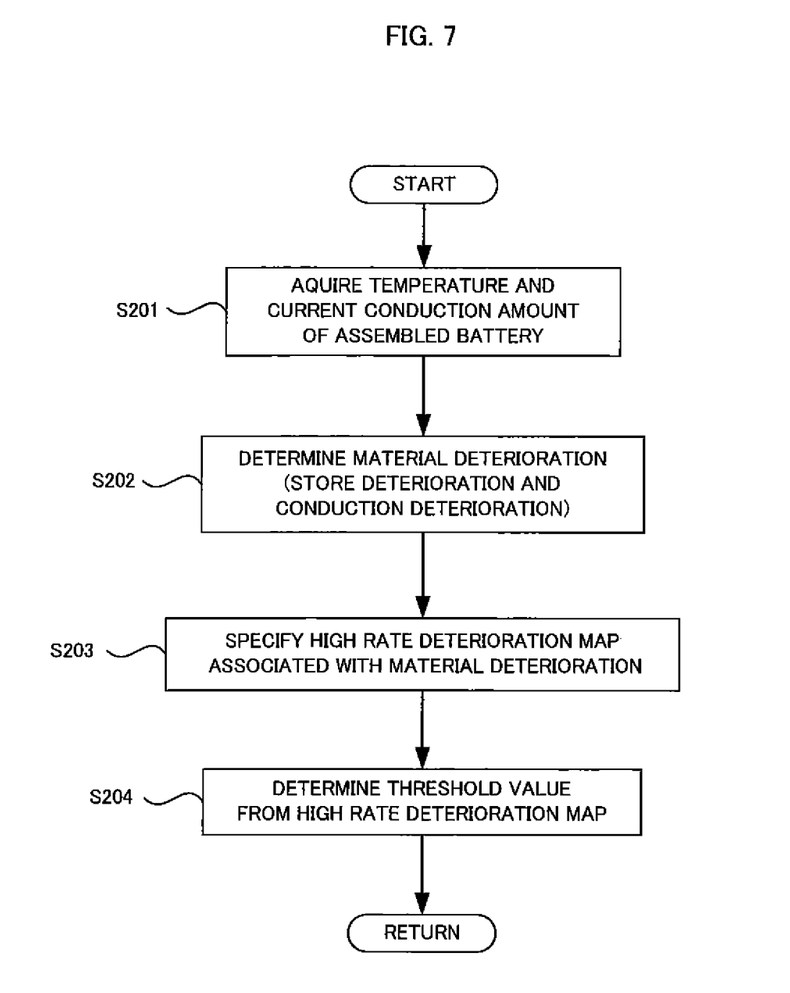
FIG. 7 is a flow chart showing processing of determining a threshold value in the first embodiment.

At step S201, the controller 30 acquires the temperature of the assembled battery 10 when charge/discharge is not performed, the temperature of the assembled battery 10 when charge/discharge is performed, and the current conduction amount of the assembled battery when charge/discharge is performed. The case where charge/discharge of the assembled battery 10 is not performed refers to the case where the vehicle having the assembled battery 10 mounted thereon is left undriven. The temperature of the assembled battery 10 can be acquired on the basis of the output from the temperature sensor 26. The current conduction amount can be acquired on the basis of the output from the current sensor 25.

The temperature of the assembled battery 10 when charge/discharge is not performed can be acquired, for example by using a temperature sensor (different from the temperature sensor 26) previously provided for the vehicle to detect the outside air temperature. Alternatively, the detection result of the temperature sensor 26 immediately after the switching of the ignition switch from OFF to ON can be used as the temperature of the assembled battery 10 when charge/discharge is not performed.

At step S202, the controller 30 determines (estimates) the material deterioration of the assembled battery 10 (cell 11) based on the information acquired at step S201. The deterioration of the assembled battery 10 (cell 11) is classified into the high rate deterioration and the material deterioration. The material deterioration (corresponding to a second deterioration component) refers to deterioration dependent on the material of the cell 11. The material deterioration is classified into a deterioration component (referred to as storage deterioration) when charge/discharge of the assembled battery 10 is not performed and a deterioration component (referred to as conduction deterioration) when charge/discharge of the assembled battery 10 is performed.

The storage deterioration can be determined on the basis of the temperature of the assembled battery 10 when charge/discharge is not performed, that is, the temperature of the assembled battery 10 when the vehicle is left undriven. The storage deterioration can be determined by previously providing a map showing the correspondence between the temperature of the assembled battery 10 when charge/discharge is not performed and the storage deterioration.

The conduction deterioration can be determined on the basis of the temperature and the current conduction amount of the assembled battery 10 when charge/discharge is performed. The conduction deterioration can be determined by previously providing a map showing the correspondence between the temperature and the current conduction amount of the assembled battery 10 when charge/discharge is performed and the conduction deterioration. Once the storage deterioration and the conduction deterioration are determined, the material deterioration can be determined.

Figure 8:
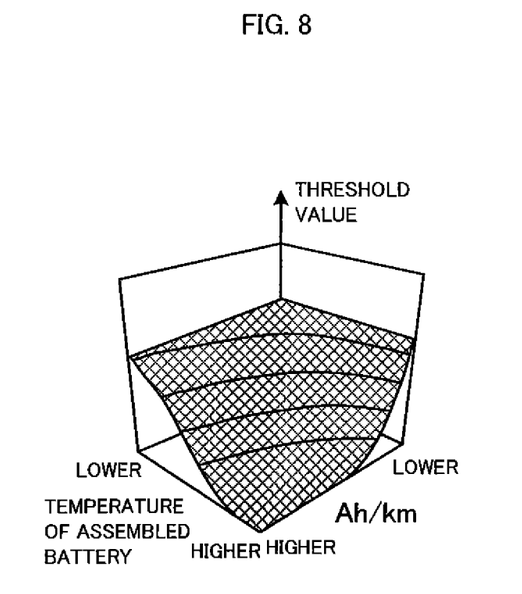
FIG. 8 is a diagram showing a map for specifying the threshold value in the first embodiment.
Figure 9:
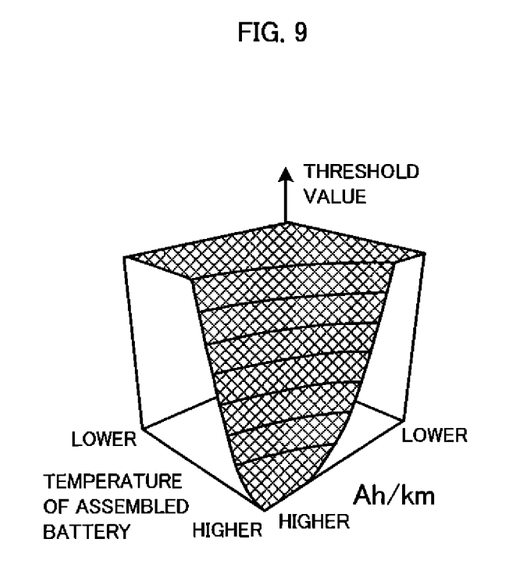
FIG. 9 is a diagram showing a map for specifying the threshold value in the first embodiment.

At step S203, the controller 30 specifies a map of the high rate deterioration for determining the threshold value based on the material deterioration determined at step S202. As shown in FIG. 8 and FIG. 9, the map of the high rate deterioration shows the relationship between the threshold value, the temperature (average temperature in this case) of the assembled battery 10 when charge/discharge is performed, and the use state (Ah/km) of the assembled battery 10. The use state (Ah/km) of the assembled battery 10 corresponds to a charge/discharge amount of the assembled battery 10 relative to the running distance of the vehicle and can be calculated on the basis of the output from a running distance sensor and the output from the current sensor 25.

FIG. 8 and FIG. 9 shows the maps provided at different levels of the material deterioration. The material deterioration in the map shown in FIG. 8 is at a higher level than the material deterioration in the map shown in FIG. 9. Since the deterioration of the assembled battery 10 (cell 11) is classified into the material deterioration and the high rate deterioration, an increased level of the material deterioration reduces the proportion in which the high rate deterioration is permitted, and reduces the threshold value accordingly. The threshold value shown in FIG. 8 is smaller than the threshold value shown in FIG. 9.

For example, since the material deterioration is less likely to occur in a low-temperature environment, the proportion in which the high rate deterioration is permitted can be increased. When a plurality of maps as shown in FIG. 8 and FIG. 9 are prepared for a plurality of levels of the material deterioration, one of the maps can be specified in association with the material deterioration determined at step S202.

At step S204, the controller 30 determines the threshold value by using the map of the high rate deterioration specified at step S203. Specifically, the controller 30 acquires the temperature of the assembled battery 10 and the use state (Ah/km) of the assembled battery 10 to determine the threshold value associated with the temperature and the use state (Ah/km) of the assembled battery 10. The threshold value is used in the processing at step S112 of FIG. 3.

At step S113, the controller 30 sets an output limit value for use in controlling charge/discharge of the assembled battery 10 at the maximum value. The output limit value is a value for limiting the discharge of the assembled battery 10. The controller 30 controls the discharge of the assembled battery 10 such that the output from the assembled battery 10 does not exceed the output limit value.

At step S114, the controller 30 sets the output limit value at a value smaller than the maximum value. The controller 30 can set an amount by which the output limit value is reduced from the maximum value in accordance with the difference between the integral value $\Sigma D(N)$ and the threshold value. For example, the controller 30 can calculate the output limit value based on the following expression (5):

$$Wout = W(MAX) - L \times (\Sigma D(N) - K) \qquad (5)$$

where Wout represents the output limit value for use in discharge control, and W(MAX) represents the maximum value of the output limit value. L represents a coefficient. K represents the threshold value described at step S112.

The value of "$L \times (\Sigma D(N) - K)$" represents the amount by which the output limit value is reduced. The reduction amount can be adjusted by changing the coefficient L. Specifically, the reduction amount can be adjusted in view of the drivability of the vehicle.

At step S115, the controller 30 transmits an instruction relating to the discharge control of the assembled battery 10 to the inverter 23. The instruction includes the information about the output limit value set at step S113 or step S114. This achieves the discharge control of the assembled battery 10 such that the discharge power of the assembled battery 10 does not exceed the output limit value.

At step S116, the controller 30 stores the present evaluation value D(N) and the integral value $\Sigma D(N)$ in the memory 31. The storage of the evaluation value D(N) in the memory 31 allows monitoring of changes in the evaluation value D(N). The storage of the integral value $\Sigma D(N)$ in the memory 31 enables updating of the integral value $\Sigma D(N)$ when the next evaluation value D(N+1) exceeds the target value.

On the other hand, when the evaluation value D(N) is smaller than the target value at step S110, the controller 30 proceeds to step S117. The controller 30 stores the evaluation value D(N) in the memory 31 at step S117. This allows monitoring of changes in the evaluation value D(N).

According to the present embodiment, when the integral value $\Sigma D(N)$ is higher than the threshold value, the discharge of the assembled battery 10 can be further limited to suppress the deterioration of the assembled battery 10 (cell 11) due to the high rate deterioration. Since the output limit value remains at the set maximum value until the integral value $\Sigma D(N)$ reaches the threshold value, the output from the assembled battery 10 can be used to satisfy the dynamic performance of the vehicle required by the driver.

Figure 10:
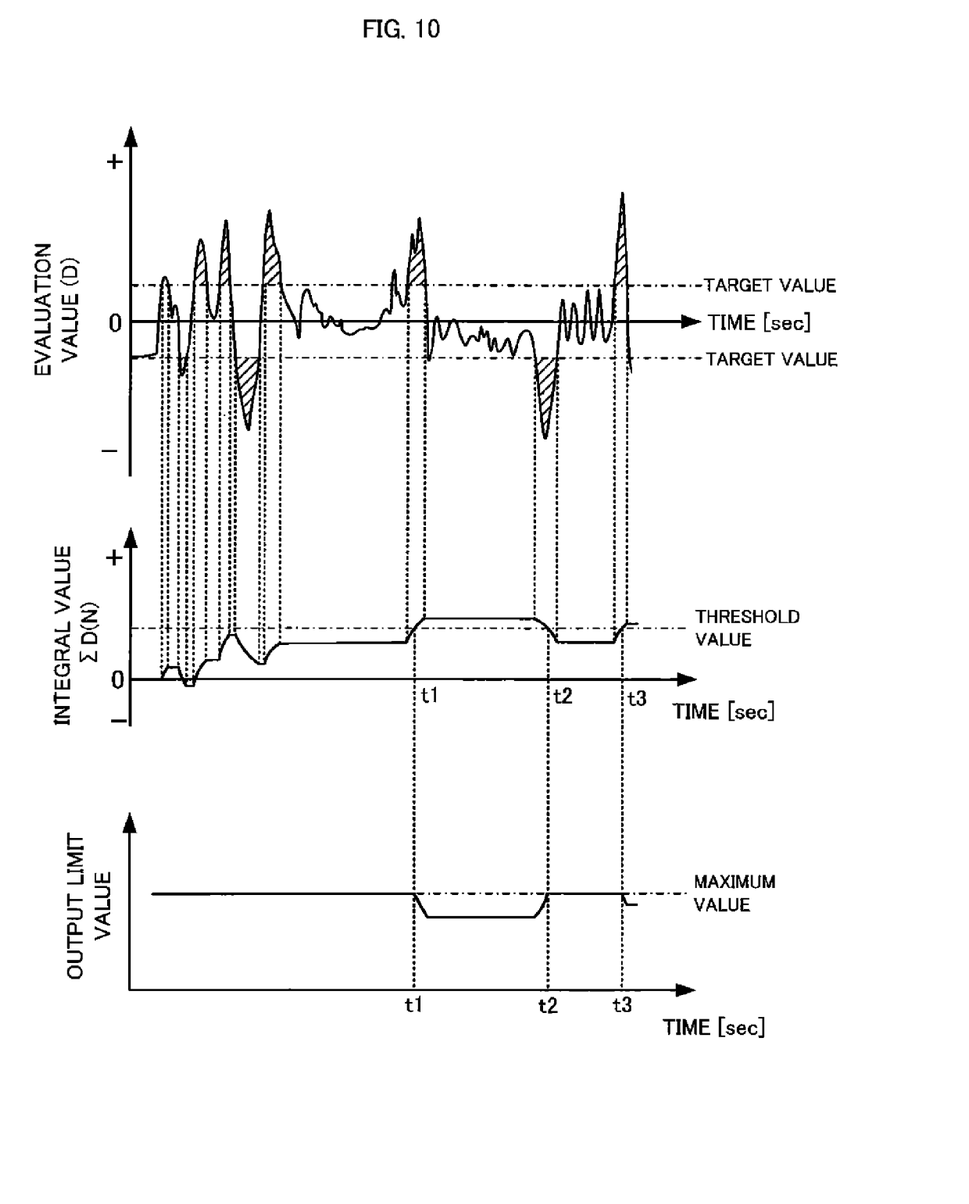
FIG. 10 is a graph showing changes in the evaluation value, an integral value, and an output limit value in the first embodiment.

FIG. 10 is a timing chart (by way of example) showing changes in the integral value $\Sigma D(N)$ and the output limit value associated with changes in the evaluation value D(N).

Each time the evaluation value D(N) exceeds the target value, the integral value $\Sigma D(N)$ is updated. When the integral value $\Sigma D(N)$ reaches the threshold value at a time t1, the output limit value is changed. This limits the discharge of the assembled battery 10. As the difference between the integral value $\Sigma D(N)$ and the threshold value is increased, the output limit value is reduced. On the other hand, the output limit value is maintained at the maximum value until the integral value $\Sigma D(N)$ reaches the threshold value.

At a time t2, the integral value $\Sigma D(N)$ becomes smaller than the threshold value. This causes the output limit value to be set at the maximum value. In a period before the time t2, the output limit value approaches the maximum value toward the time t2. The output limit value is set at the maximum value from the time t2 to a time t3. Since the integral value $\Sigma D(N)$ exceeds the threshold value at the time t3, the output limit value is changed. The output limit value is reduced in accordance with the difference between the integral value $\Sigma D(N)$ and the threshold value.

In the present embodiment, even when the evaluation value D(N) exceeds the target value, the output limit value is not changed at that time. The output limit value is changed at the time when the integral value $\Sigma D(N)$ reaches the target value. Through the control, the assembled battery 10 can be discharged with the output limit value set at the maximum value even after the evaluation value D(N) exceeds the target value, thereby ensuring the dynamic performance required by the driver.

According to the present embodiment, the estimation of the material deterioration of the cell 11 can specify the range in which the high rate deterioration can be permitted. The threshold value is set appropriately for the range in which the high rate deterioration can be permitted, so that the assembled battery 10 can be discharged within the range in which the high rate deterioration can be permitted. When the discharge of the assembled battery 10 is ensured, the dynamic performance required by the driver can be ensured.

While the evaluation value D(N) is stored in the memory 31 for each cycle time, and the previous (immediately preceding) evaluation value D(N−1) stored in the memory 31 is used to calculate the present evaluation value D(N) in the present embodiment, the present invention is not limited thereto. The evaluation value D(N) can be calculated on the basis of a history of discharge current values. For example, only the history of discharge current values can be stored in the memory 31 and used to calculate the evaluation value D(N) in a particular cycle time.

While the target value used at step S110 of FIG. 3 is the preset fixed value in the present embodiment, the present invention is not limited thereto. In other words, the target value can be changed. Specifically, the material deterioration is estimated to specify the range in which the high rate deterioration can be permitted similarly to the present embodiment. When the range in which the high rate deterioration can be permitted is narrower than a reference range, the target value can be set at a value lower than the value associated with the reference range. This setting can increase the number of evaluation values D(N) used in the calculation of the integral value ΣD(N). On the other hand, when the range in which the high rate deterioration can be permitted is wider than the reference range, the target value can be set at a value higher than the value associated with the reference range. This setting can reduce the number of evaluation values D(N) used in the calculation of the integral value ΣD(N).

The invention claimed is:

1. A control apparatus configured to control discharge of a secondary battery such that a discharge power of the secondary battery does not exceed an upper limit value, comprising:
   a current sensor detecting a current value during charge and discharge of the secondary battery; and
   a controller calculating an evaluation value from a discharge state detected by using the current sensor, and reducing the upper limit value when an integral value of the evaluation value exceeds a threshold value, the integral value being calculated by performing integration of at least a part of the evaluation value that exceeds a target value, the evaluation value for evaluating a first deterioration component reducing output performance of the secondary battery with nonuniformity of an ion concentration in an electrolyte due to discharge of the secondary battery,
   wherein the controller estimates a second deterioration component representing deterioration of a negative electrode material and/or a positive electrode material of the secondary battery, and changes the threshold value such that an increase in the integral value until the integral value reaches the threshold value is reduced as the second deterioration component is increased, and the increase in the integral value until the integral value reaches the threshold value is increased as the second deterioration component is reduced.

2. The control apparatus according to claim 1, wherein the controller calculates the integral value such that, when the evaluation value on a positive side exceeds the target value on a positive side, the controller adds a part of the evaluation value on the positive side that exceeds the target value on the positive side, and
   when the evaluation value on a negative side exceeds the target value on a negative side, the controller subtracts a part of the evaluation value on the negative side that exceeds the target value on the negative side.

3. The control apparatus according to claim 1, wherein the controller estimates the second deterioration component by using a temperature and a current conduction amount of the secondary battery.

4. The control apparatus according to claim 3, wherein the temperature of the secondary battery includes a temperature of the secondary battery when charge/discharge is performed and a temperature of the secondary battery when charge/discharge is not performed.

5. The control apparatus according to claim 1, further comprising a memory configured to store a map for determining the threshold value in association with the second deterioration component,
   wherein the controller determines the threshold value by using one of a plurality of the maps stored in the memory, the one being associated with the estimated second deterioration component.

6. The control apparatus according to claim 1, wherein the controller increases the evaluation value in accordance with an increase in the nonuniformity of the ion concentration and reduces the evaluation value in accordance with a reduction in the nonuniformity of the ion concentration.

7. The control apparatus according to claim 1, wherein the secondary battery outputs an energy for use in running of a vehicle.

8. A control method for controlling discharge of a secondary battery such that a discharge power of the secondary battery does not exceed an upper limit value, comprising the steps of:
   detecting a current value during charge and discharge of the secondary battery by using a current sensor;
   calculating an evaluation value from a discharge state detected by using the current sensor, the evaluation value for evaluating a first deterioration component reducing output performance of the secondary battery with nonuniformity of an ion concentration in an electrolyte due to discharge of the secondary battery;
   determining whether or not the evaluation value exceeds a target value and reducing the upper limit value when an integral value of the evaluation value exceeds a threshold value, the integral value being calculated by performing integration of at least a part of the evaluation value that exceeds a target value,
   estimating a second deterioration component representing deterioration of a negative electrode material and/or a positive electrode material of the secondary battery;
   changing the threshold value such that an increase in the integral value until the integral value reaches the threshold value is reduced as the second deterioration component is increased, and the increase in the integral value until the integral value reaches the threshold value is increased as the second deterioration component is reduced.

9. The control method according to claim 8, wherein the integral value is calculated such that, when the evaluation value on a positive side exceeds the target value on a positive side, a part of the evaluation value on the positive side that exceeds the target value on the positive side is added, and when the evaluation value on a negative side exceeds the target value on a negative side, a part of the evaluation value on the negative side that exceeds the target value on the negative side is subtracted.

10. The control method according to claim 8, wherein the second deterioration component is estimated by using a temperature and a current conduction amount of the secondary battery.

11. The control method according to claim 10, wherein the temperature of the secondary battery includes a temperature of the secondary battery when charge/discharge is performed and a temperature of the secondary battery when charge/discharge is not performed.

12. The control method according to claim 8, wherein the threshold value is determined by using one of a plurality of maps used for determining the threshold value and associated with the second deterioration component, the one being associated with the estimated second deterioration component.

13. The control method according to claim 8, wherein the evaluation value is increased in accordance with an increase in the nonuniformity of the ion concentration and is reduced in accordance with a reduction in the nonuniformity of the ion concentration.

\* \* \* \* \*